United States Patent
Arai et al.

(10) Patent No.: US 8,035,804 B2
(45) Date of Patent: Oct. 11, 2011

(54) EXPOSURE APPARATUS AND DEVICE MANUFACTURING METHOD

(75) Inventors: Tadashi Arai, Utsunomiya (JP); Yasuo Hasegawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 749 days.

(21) Appl. No.: 12/098,637

(22) Filed: Apr. 7, 2008

(65) Prior Publication Data

US 2008/0259307 A1    Oct. 23, 2008

(30) Foreign Application Priority Data

Apr. 20, 2007  (JP) .................. 2007-112295

(51) Int. Cl.
| G02B 26/02 | (2006.01) |
| G03B 27/32 | (2006.01) |
| G03B 27/42 | (2006.01) |
| G03B 27/54 | (2006.01) |
| G03B 27/72 | (2006.01) |

(52) U.S. Cl. ............ 355/71; 355/35; 355/53; 355/67; 359/229

(58) Field of Classification Search ............ 250/492.2; 353/97; 355/35, 67, 71–72, 74, 77, 52–53; 359/229, 232; 430/5, 30
See application file for complete search history.

(56) References Cited

U.S. PATENT DOCUMENTS

| 5,592,329 A | 1/1997 | Ishiyama et al. | |
| 2001/0046039 A1* | 11/2001 | Kudo | 355/67 |
| 2003/0020893 A1* | 1/2003 | Kawashima | 355/67 |
| 2004/0032577 A1* | 2/2004 | Tsai et al. | 355/71 |
| 2006/0146308 A1* | 7/2006 | Cebuhar et al. | 355/67 |
| 2006/0176461 A1 | 8/2006 | Sekine | |

FOREIGN PATENT DOCUMENTS

| JP | 06-235863 A | 8/1994 |
| JP | 11-219892 A | 8/1999 |
| JP | 2000-164500 A | 6/2000 |
| JP | 2003-017396 A | 1/2003 |
| JP | 2003-344771 A | 12/2003 |
| JP | 2005-086148 A | 3/2005 |
| JP | 2006-222222 A | 8/2006 |
| WO | WO 2006128613 A1 * | 12/2006 |

OTHER PUBLICATIONS

Japanese Office Action issued on Feb. 9, 2009 for Japanese Patent Application No. 2007-112295.

* cited by examiner

*Primary Examiner* — Hung Hnery Nguyen
*Assistant Examiner* — Colin Kreutzer
(74) *Attorney, Agent, or Firm* — Canon U.S.A., Inc., IP Division

(57) ABSTRACT

A scanning exposure apparatus which exposes a substrate is disclosed. The apparatus comprises an illumination system configured to illuminate an illumination region of an original, a projection optical system configured to project a pattern of the original onto the substrate, and a stop configured to shield a flare generating component of flare light which travels from the projection optical system to the substrate, and to pass the remaining component of the flare light. An aperture of the stop has a shape different from a shape of the illumination region, and the aperture of the stop includes a portion whose dimension in a first direction parallel to a scanning direction of the substrate changes in accordance with a distance from the center of the aperture in a second direction perpendicular to the first direction.

10 Claims, 13 Drawing Sheets

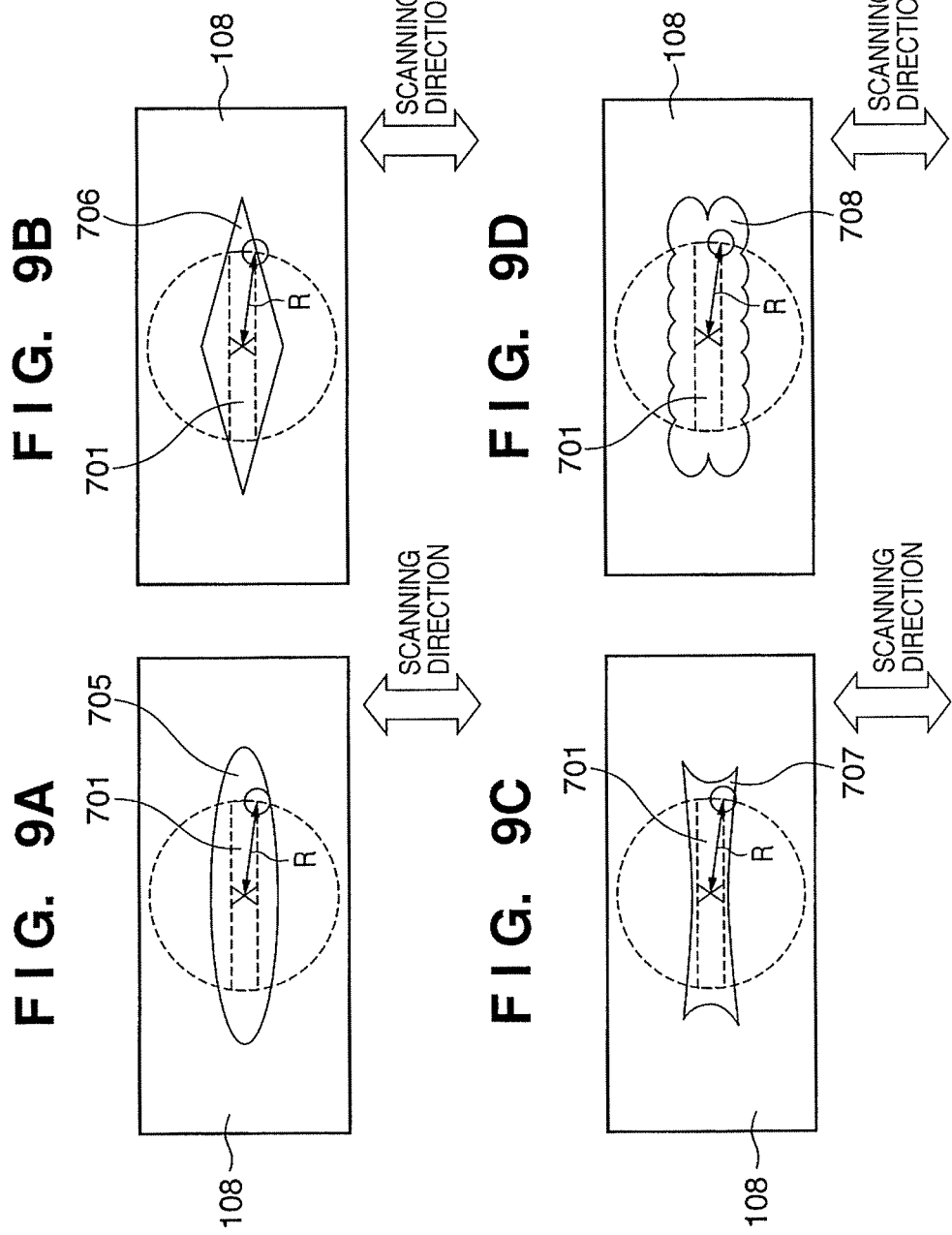

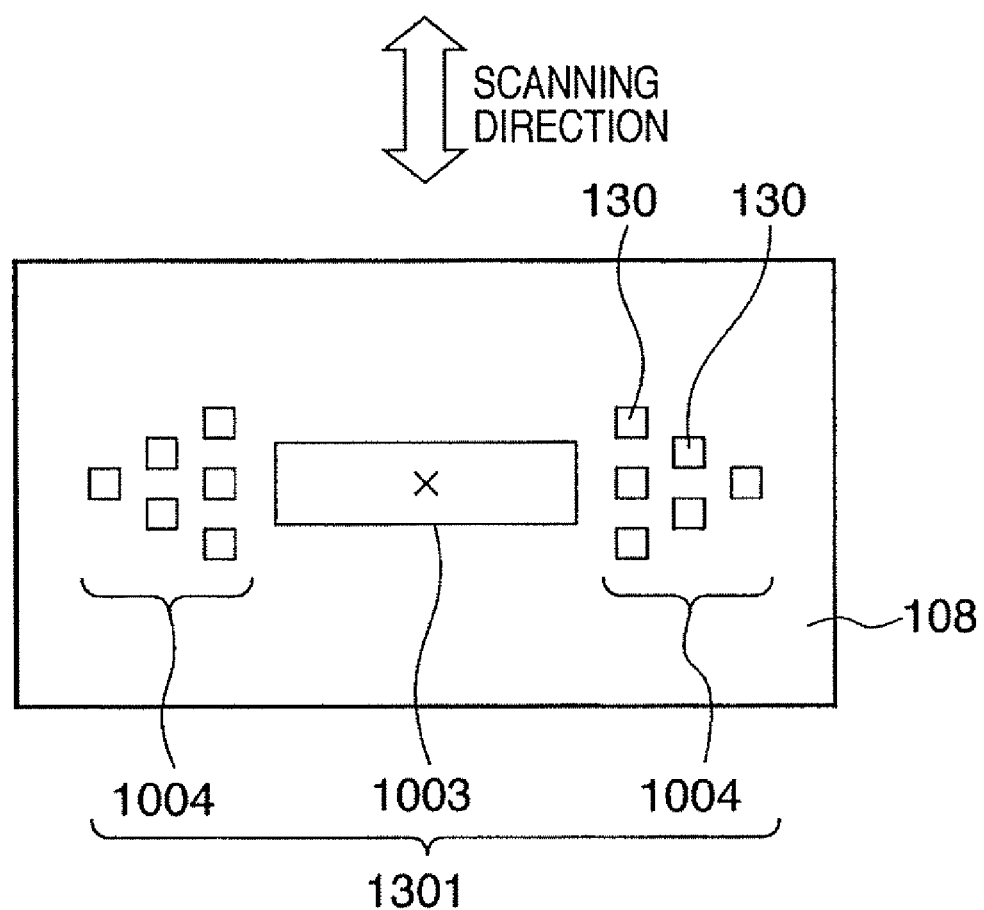

EXPOSURE APPARATUS AND DEVICE MANUFACTURING METHOD

BACKGROUND OF THE INVENTION

1. Field of the Invention

The present invention relates to an exposure apparatus which projects the pattern of an original onto a substrate via a projection optical system to expose the substrate to light, and a device manufacturing method using the same.

2. Description of the Related Art

An exposure apparatus having a projection optical system is employed in lithography for manufacturing a device such as a semiconductor integrated circuit device. The exposure apparatus projects the pattern of an original called a reticle or mask onto each shot region on a substrate such as a wafer or glass plate coated with a photosensitive agent (photoresist) to expose the substrate (photosensitive agent) to light. With this operation, the pattern of the original is transferred onto the photosensitive agent.

In recent years, a demand for a higher line width uniformity of a pattern transferred onto a substrate by an exposure apparatus is increasing. Along with this demand, deteriorations in contrast and line width uniformity (CD uniformity) of a projected image are becoming problematic due to the presence of flare (stray light or fogging light) generated by a projection optical system, which has been negligible conventionally.

Flare generated by a projection optical system is roughly classified into long-range flare and local flare. The two types of flare are distinguished from each other on the basis of the distance at which fogging occurs. In general, long-range flare is generated at a distance of about 0.1 mm or more from the original projected image, while local flare is generated at a distance of about 0.1 μm to 0.1 mm from it.

Long-range flare is generated mainly due to reflection by a coating film on an optical element and reflection/transmission/scattering by a lens edge and mechanical components. Local flare is generated mainly due to the presence of forward-scattered light generated by the surface of an optical element (e.g., a lens) of an optical system and a coating film on the optical element within a relatively small angular range.

The contrast and the line width uniformity of a projected image deteriorate due to the presence of long-range flare. The contrast of a projected image deteriorates depending on the flare amount, while its line width uniformity deteriorates depending on the difference in image heights with respect to the flare amount. The insertion of a field stop is effective in preventing long-range flare.

Japanese Patent Laid-Open Nos. 2006-222222 and 11-219892 each propose an exposure apparatus in which a stop is built in a projection optical system.

It is possible to increase the productivity by laying out as many shot regions on one substrate as possible. In view of this, a shot layout in which the interval of each shot region is minimized can be adopted to reduce any wasted area. In such a shot layout, flare light in an exposure-in-progress shot region often leaks into adjacent shot regions. This causes a difference in flare amount between the peripheral portion and central portion in a shot region adjacent to other shot regions. In other words, the flare amount changes depending on the difference in image heights, resulting in deterioration in line width uniformity.

SUMMARY OF THE INVENTION

The present invention has been made in consideration of the above-described problem, and has as its object to suppress degradation in imaging characteristic due to, e.g., the presence of flare.

According to the first aspect of the present invention, there is provided a scanning exposure apparatus which exposes a substrate, the apparatus comprising an illumination system configured to illuminate an illumination region of an original, a projection optical system configured to project a pattern of the original onto the substrate, and a stop configured to shield a flare generating component of flare light which travels from the projection optical system to the substrate, and to pass the remaining component of the flare light, wherein an aperture of the stop has a shape different from a shape of the illumination region, and wherein the aperture of the stop includes a portion whose dimension in a first direction parallel to a scanning direction of the substrate changes in accordance with a distance from the center of the aperture in a second direction perpendicular to the first direction.

According to the second aspect of the present invention, there is provided a scanning exposure apparatus which exposes a substrate, the apparatus comprising an illumination system configured to illuminate an original, a projection optical system configured to project a pattern of the original onto the substrate, and a stop configured to shield a flare generating component of flare light which travels from the projection optical system to the substrate, and to pass the remaining component of the flare light, wherein an aperture of the stop includes a portion whose dimension in a first direction parallel to a scanning direction of the substrate changes in accordance with a distance from the center of the aperture in a second direction perpendicular to the first direction, and wherein the stop is inserted between the projection optical system and a plane on which the substrate is set.

According to the third aspect of the present invention, there is provided a scanning exposure apparatus which exposes a substrate, the apparatus comprising an illumination system configured to illuminate an original, a projection optical system configured to project a pattern of the original onto the substrate, and a stop configured to shield a flare generating component of flare light which travels from the projection optical system to the substrate, and to pass the remaining component of the flare light, wherein the stop includes a portion configured such that an integral amount in a first direction parallel to a scanning direction of the substrate, of a component of the flare light, passing through the stop decreases in accordance with a distance from the center of an aperture of the stop in a second direction perpendicular to the first direction, and the stop is inserted between the projection optical system and a plane on which the substrate is set, and wherein the stop is inserted between the projection optical system and a plane on which the substrate is set.

According to the fourth aspect of the present invention, there is provided a device manufacturing method comprising the steps of exposing a substrate coated with a photosensitive agent using an exposure apparatus as defined above, and developing the photosensitive agent on the substrate.

According to the present invention, it is possible to suppress degradation in imaging characteristic due to, e.g., the presence of flare.

Further features and aspects of the present invention will become apparent from the following description of exemplary embodiments with reference to the attached drawings.

BRIEF DESCRIPTION OF THE DRAWINGS

FIGS. 9A to 9D each illustrate the aperture shape of a stop;

FIG. 13 illustrates the aperture shape of a stop.

DESCRIPTION OF THE EMBODIMENT

A preferred embodiment of the present invention will be described below with reference to the accompanying drawings.

Figure 1:
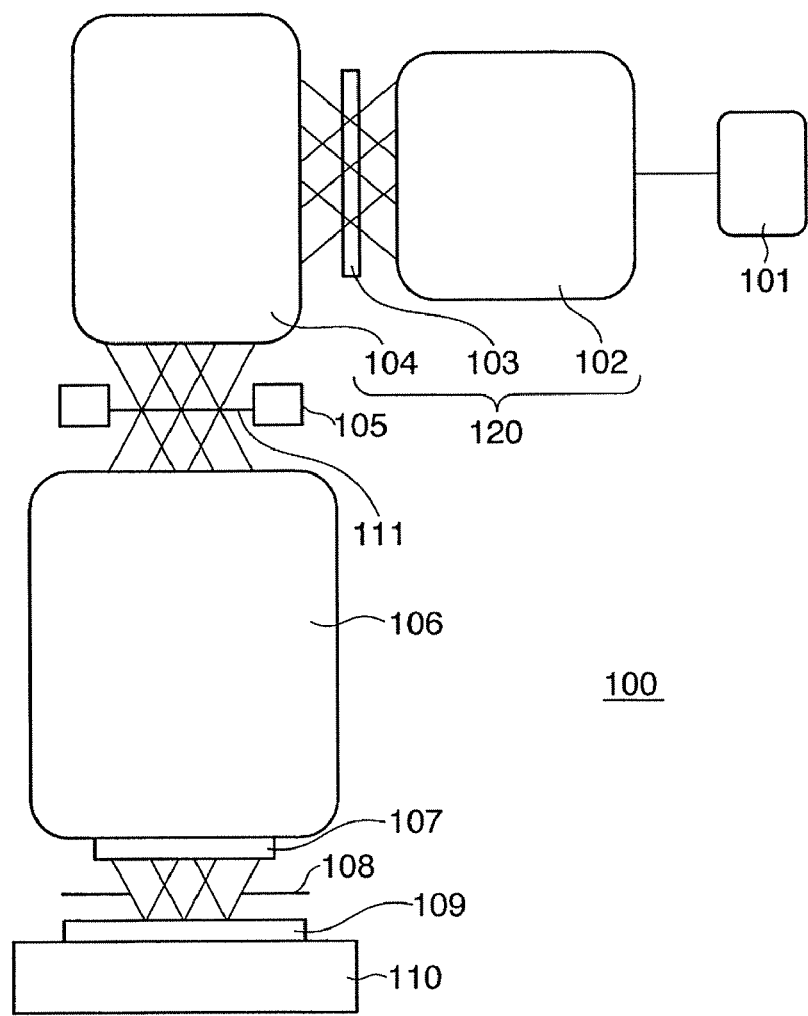
FIG. 1 shows the schematic arrangement of an exposure apparatus according to a preferred embodiment of the present invention.

FIG. 1 shows the schematic arrangement of an exposure apparatus according to a preferred embodiment of the present invention. A case in which the present invention is applied to a scanning exposure apparatus will be exemplified hereinafter. However, the present invention is also applicable to an exposure apparatus which exposes a substrate while an original and substrate are kept stationary.

An illumination optical system 120 includes, e.g., a first illumination optical unit 102, second illumination optical unit 103, and third illumination optical unit 104, and illuminates an original 111 with a laser beam supplied by a light source 101. Although the light source 101 can be, e.g., an excimer laser which outputs light with a wavelength of 193 nm or 248 nm, it is merely an example. It is also possible to use other light sources. The first illumination optical unit 102 receives the light supplied by the light source 101 and generates light having undergone control of, for example, the effective light source distribution and polarization state. The second illumination optical unit 103 receives the light supplied by the first illumination optical unit 102 and generates slit light having undergone control of, for example, the sectional shape and illuminance distribution. The third illumination optical unit 104 guides the light, which is supplied by, for example, the second illumination optical unit 103, to the original 111 to illuminate a predetermined illumination region on the original 111. The illumination region has a rectangular shape formed by a pair of opposite sides parallel to the scanning direction and a pair of opposite sides perpendicular to the scanning direction.

An exposure apparatus 100 projects the pattern of the original 111 onto a substrate 109, which is coated with a photosensitive agent, via a projection optical system 106 to expose the photosensitive agent. With this operation, the pattern of the original 111 is transferred onto the photosensitive agent. A scanning exposure apparatus exposes each shot region on the substrate 109 to light by synchronously scan-driving the substrate 109 and original 111 using a substrate driving mechanism 110 and original driving mechanism 105, respectively.

Long-range flare is generated, for example, as light reflected by the substrate 109 is reflected by an optical element of the projection optical system 106, e.g., an optical element 107 closest to the substrate 109 and incident on the substrate 109 again. Light which contributes to forming a target image on the substrate 109 will be called imaging light, and light which generates flare will be called flare light hereinafter.

The exposure apparatus 100 comprises a stop 108 for preventing a decrease in imaging characteristic due to the presence of flare. The stop 108 shields a flare generating component of flare light which travels from the projection optical system 106 to the substrate 109, and passes the remaining component of the flare light. For example, the stop 108 can be inserted between the projection optical system 106 and a plane on which the substrate 109 is set. More specifically, the stop 108 can be inserted between a plane on which the substrate 109 is set and the optical element 107 closest to the plane among optical elements of the projection optical system 106. Assume that the projection optical system 106 has a plane (intermediate image plane) on which an intermediate image as a real image is formed. In this case, the stop 108 can be inserted between two optical elements of the projection optical system 106, which face the intermediate image plane such that they face each other via the intermediate image plane. To increase the degree of isolation between imaging light and flare light, the stop 108 is preferably inserted near the image plane of the projection optical system 106 or near the intermediate image plane.

Figure 2:
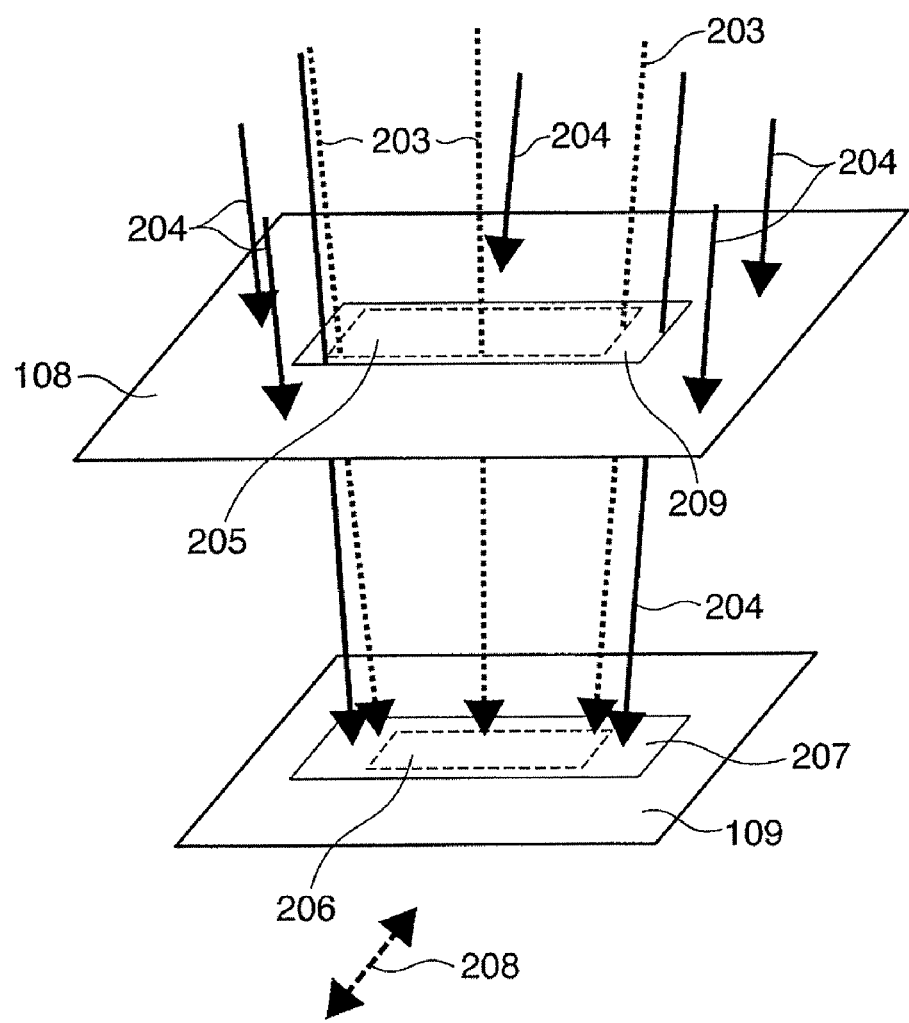
FIG. 2 schematically shows the periphery of a substrate when a stop is inserted between the substrate and a projection optical system.

FIG. 2 schematically shows the periphery of the substrate 109 when the stop 108 is inserted between the substrate 109 and the projection optical system 106 (optical element 107). Consider, for example, a case in which light reflected by the substrate 109 is reflected by an optical element closest to the substrate 109 and incident on the substrate 109 again as flare light. To shield flare light 204, the stop 108 needs to be inserted between the substrate 109 and the optical element closest to it.

An aperture 209 of the stop 108 is formed larger than an exposure region (a region through which imaging light 203 passes) 205 on the plane of the stop 108 so that the aperture 209 does not eclipse the imaging light 203. A flare light reaching region 207 as a region where flare light reaches on the substrate 109 is generally larger than an exposure region (a region where the imaging light 203 enters) 206 on the substrate 109.

Figure 3A:
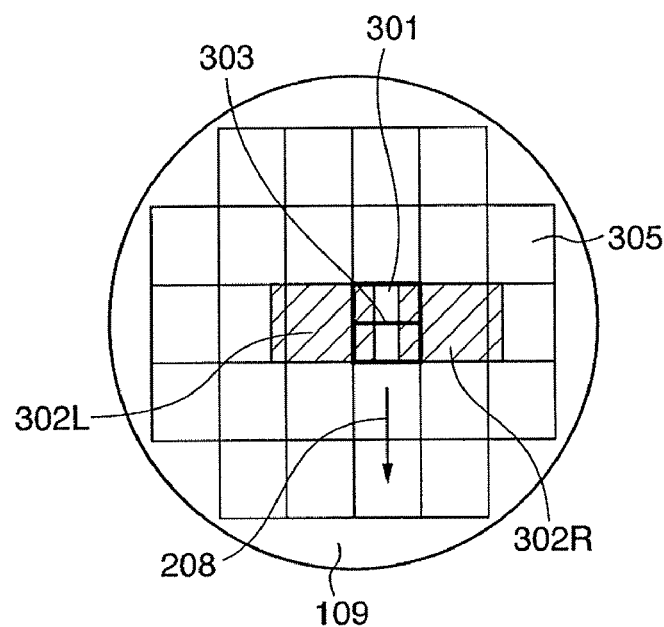
FIGS. 3A and 3B are a diagram and a graph for explaining the flare amount vs. image height distribution (a change in flare amount with respect to a change in image height)
Figure 3B:
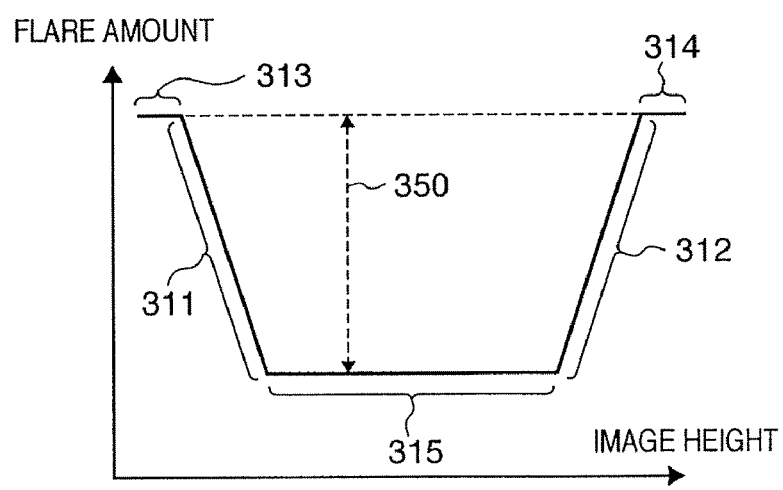

FIGS. 3A and 3B are a diagram and a graph for explaining the flare amount vs. image height distribution (a change in flare amount with respect to a change in image height). FIG. 3A illustrates the shot layout on the substrate 109. FIG. 3B illustrates the flare amount vs. image height distribution evaluated at an evaluation position 303 shown in FIG. 3A.

Consider a case in which an evaluated shot region 301 and adjacent shot regions 302L and 302R on its two sides are scan-exposed with the shot layout shown in FIG. 3A using the stop 108 having the rectangular aperture 209 as shown in FIG. 2. The flare amount at the evaluation position 303 in the evaluated shot region 301 is as shown in FIG. 3B. In other words, flare light which fogs a hatched region enters the evaluated shot region 301 upon scan-exposing the adjacent shot regions 302L and 302R, so the flare amount becomes relatively large in the peripheral portion of the evaluated shot region 301. Furthermore, the aperture 209 of the stop 108 has a rectangular shape having sides with equal length in a scanning direction 208 and parallel to the scanning direction 208.

As illustrated in FIG. 3B, the flare amount distribution has portions 311 and 313 in which the flare amount steeply changes.

Each of the portion 311 and the portion 313 on its left side indicates the amount of flare light which fogs the evaluated shot region 301 upon scan-exposing the adjacent shot region 302L on the left side of FIG. 3A. Each of a portion 312 and a portion 314 on its right side indicates the amount of flare light which fogs the evaluated shot region 301 upon scan-exposing the adjacent shot region 302R on the right side of FIG. 3A. A portion 315 corresponding to a region, which is not fogged by flare light upon scan-exposing the adjacent shot regions 302L and 302R, of the evaluated shot region 301 becomes a portion with a smallest flare amount.

As described above, a nonuniform flare amount distribution is generated depending on the degree of fogging of flare light. Referring to FIG. 3B, reference numeral 350 denotes difference in image heights, i.e., the difference between the maximum value and minimum value of the flare amount. Since the line width nonuniformity strongly depends on the flare amount distribution, it is important to flatten the flare amount distribution.

A direction parallel to the scanning direction is defined as the first direction, and a direction perpendicular to the first direction is defined as the second direction herein. In this embodiment, the aperture of the stop 108 has a portion whose dimension in the first direction changes in accordance with the distance from the center of the aperture of the stop 108 in the second direction. The use of the stop 108 having such an aperture allows effective control of the flare amount distribution. Since the scanning direction is parallel to a pair of opposite sides of four sides which define a shot region, it is also possible to define the first direction as a direction parallel to the pair of opposite sides of the shot region.

Figure 4:
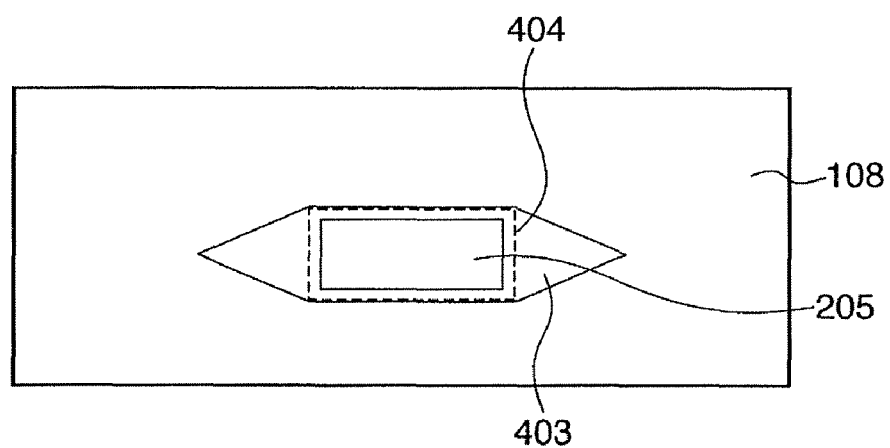
FIG. 4 illustrates the aperture shape of a stop, which is effective in uniforming the flare amount distribution.

FIG. 4 illustrates the aperture shape of a stop 108, which is effective in uniforming the flare amount distribution. To shield flare light as much as possible, an aperture 403 needs to have nearly the same shape as that of the exposure region 205 on the plane of the stop 108. However, this approach often makes the flare amount distribution nonuniform and therefore decreases the line width uniformity, as described above. To solve this problem, the aperture shape of the stop 108 is preferably determined like, e.g., the aperture 403 so that a certain component of flare light reaches an image height (region) at which the flare amount is relatively small. The aperture 403 includes a portion whose dimension in the first direction (scanning direction) decreases in a direction away from the center of the aperture 403 along the second direction (a direction perpendicular to the scanning direction).

Figure 5:
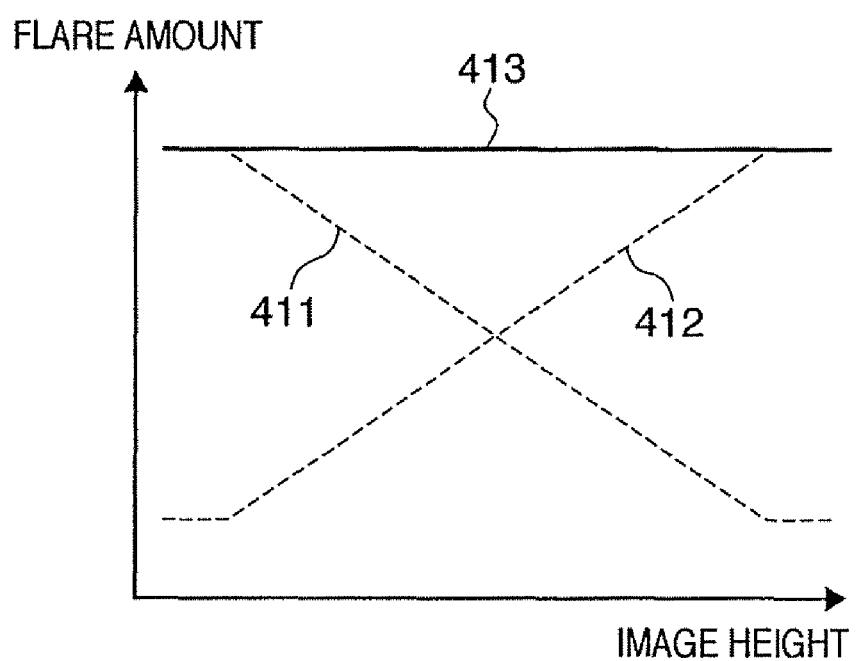
FIG. 5 illustrates the flare amount distribution when the stop illustrated in FIG. 4 is used.

FIG. 5 illustrates the flare amount distribution when the stop 108 illustrated in FIG. 4 is used. A line 411 illustrates the amount of flare light which reaches the evaluated shot region 301 upon scan-exposing the adjacent shot region 302L on the left side of the evaluated shot region 301. A line 412 illustrates the amount of flare light which reaches the evaluated shot region 301 upon scan-exposing the adjacent shot region 302R on the right side of the evaluated shot region 301. A line 413 illustrates the sum of the flare amounts indicated by the lines 411 and 412. As illustrated in FIG. 5, the sum of the flare amounts exhibits a flat distribution.

Figure 6:
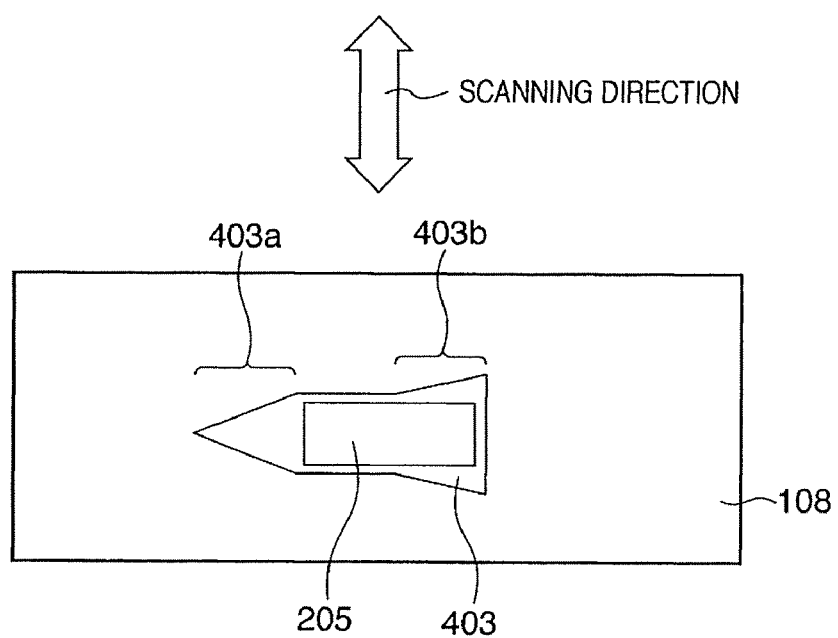
FIG. 6 illustrates the aperture shape of a stop.

FIG. 4 illustrates a stop 108 in which an aperture 403 including a portion whose dimension in the scanning direction decreases in a direction away from the center is formed. However, the present invention is not limited to this. A stop according to the present invention includes a stop in which an aperture including a portion whose dimension in the scanning direction increases in a direction away from the center is formed. Such a stop is useful in uniforming the flare amount distribution in, e.g., a shot region (e.g., a shot region 305 shown in FIG. 3A) which has an adjacent shot region on one side but has no adjacent shot region on the other side. An aperture 403 of a stop 108 illustrated in FIG. 6 includes a portion 403a, whose dimension in the scanning direction decreases in a direction away from the center of the aperture 403, on the side on which an adjacent shot region is present. The aperture 403 also includes a portion 403b, whose dimension in the scanning direction increases in a direction away from the center of the aperture 403, on the side on which any adjacent shot region is absent.

The amount of flare light which reaches the surface of the substrate 109 and the flare amount distribution change depending on exposure conditions such as the effective light source distribution and polarization condition controlled by the first illumination optical unit 102, and the slit size and illuminance distribution controlled by the second illumination optical unit 103. In addition, the amount of flare light which reaches the surface of the substrate 109 and the flare amount distribution change depending on exposure conditions such as the pattern and type of the original 111 and the shot layout on the substrate 109.

When the aperture shape of a stop is changed in correspondence with change in exposure condition, it is possible to prevent any deterioration or change in imaging performance, which depends on the exposure condition.

Figure 7:
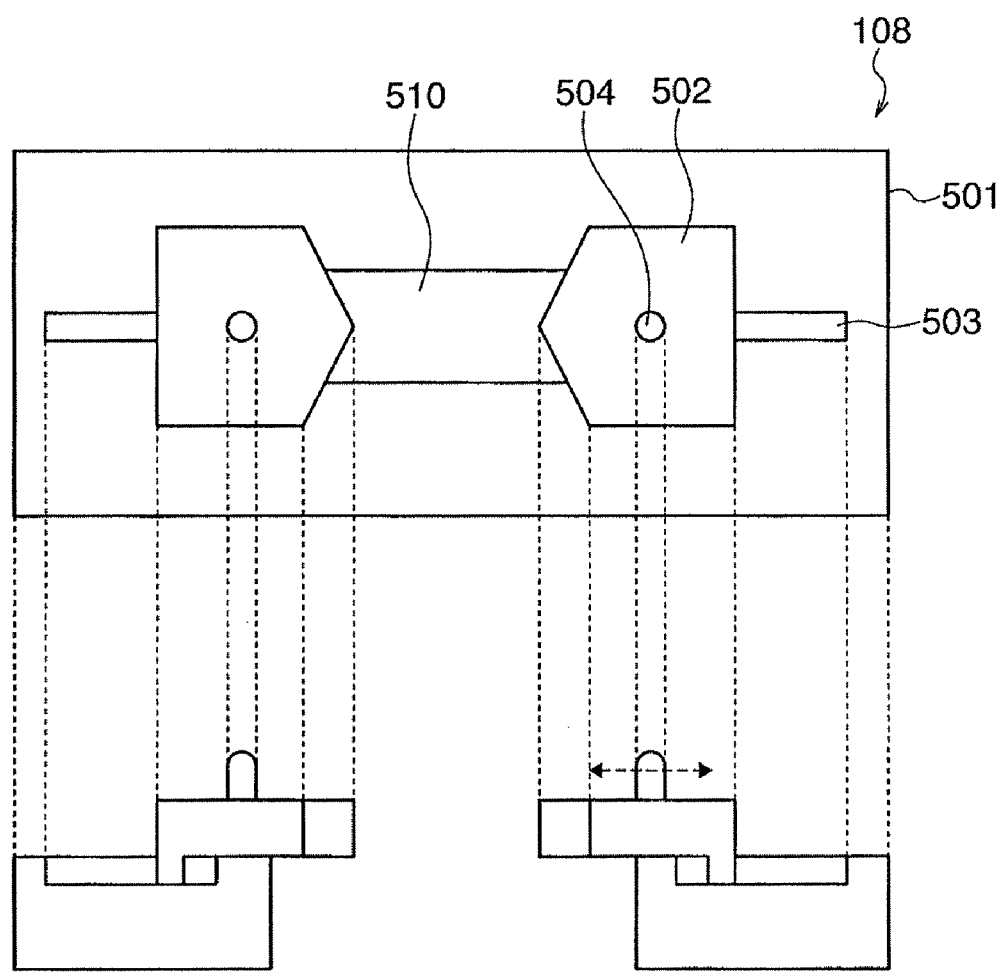
FIG. 7 illustrates a stop having a variable aperture shape.

FIG. 7 illustrates a stop having a variable aperture shape. A stop 108 illustrated in FIG. 7 includes, e.g., a stop substrate 501, movable light-shielding unit 502, guide 503, and operation unit 504. The guide 503 can be formed by, e.g., forming a groove in the stop substrate 501. The operation unit 504 is fixed to the movable light-shielding unit 502. The movable light-shielding unit 502 can be slid by gripping the operation unit 504 using a robot hand (not shown). This makes it possible to prevent any deterioration or change in imaging performance by changing the shape of an aperture 510 of the stop 108 in accordance with the exposure condition.

The shape, structure, arrangement, and the like of the stop 108 can take various forms, in addition to the above-described forms.

<Arrangement Example of Stop>

Figure 8:
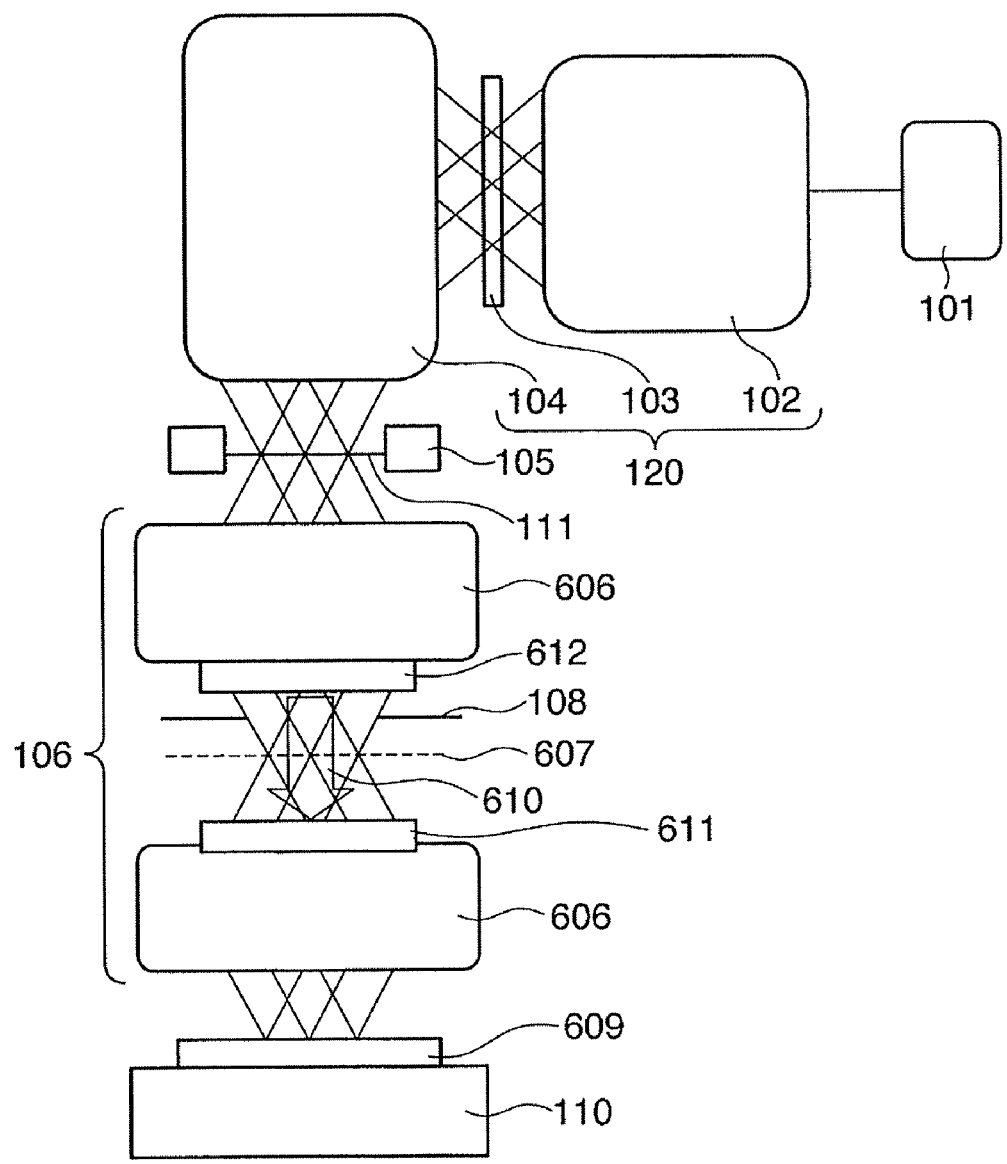
FIG. 8 shows the schematic arrangement of an exposure apparatus according to a preferred embodiment of the present invention.
Figure 10A:
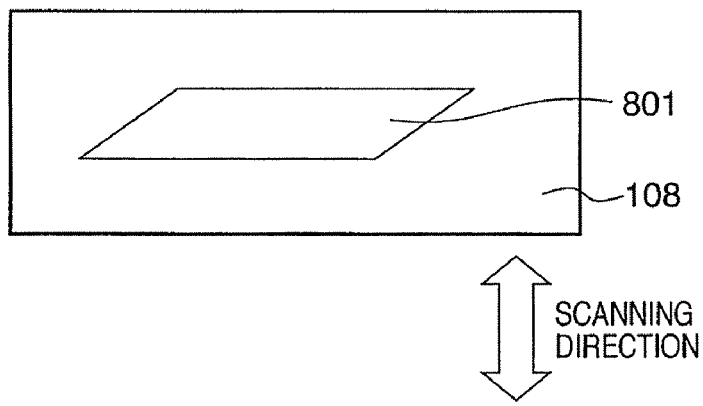
FIGS. 10A to 10C each illustrate the aperture shape of a stop.
Figure 10B:
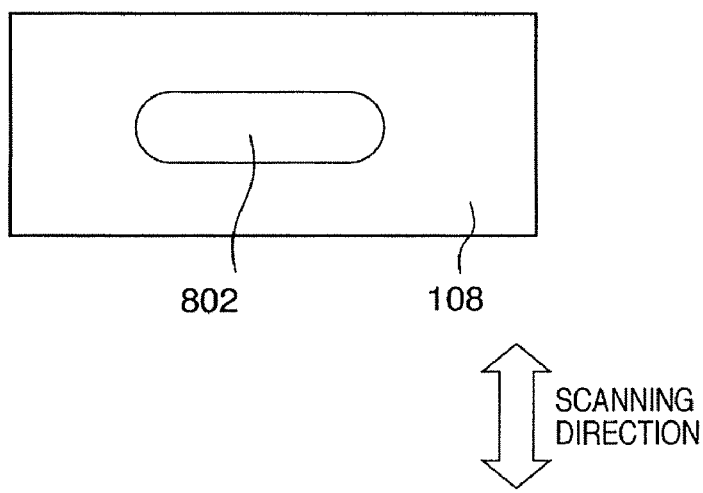
Figure 10C:
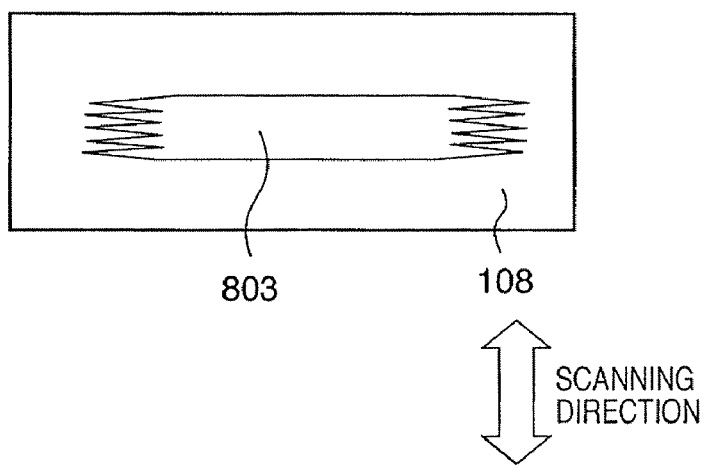
Figure 11:
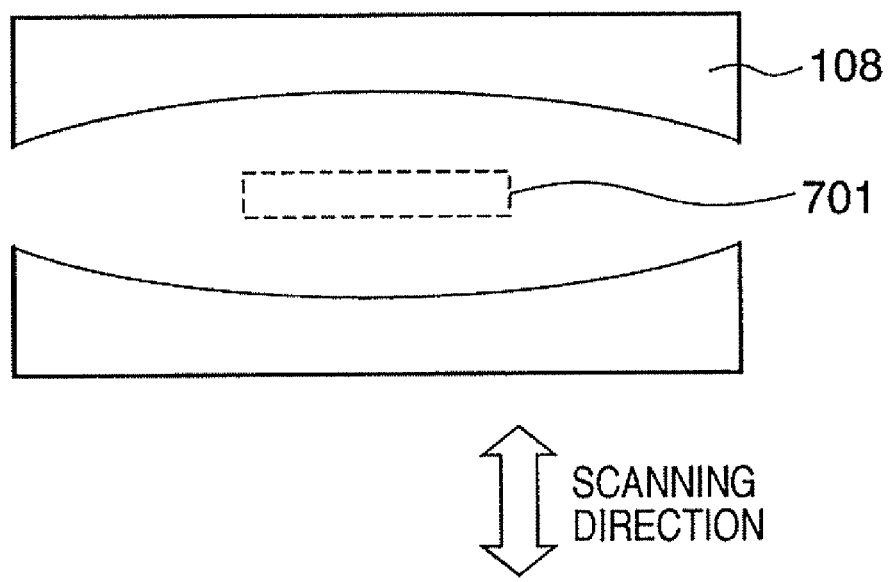
FIG. 11 illustrates the aperture shape of a stop.
Figure 12A:
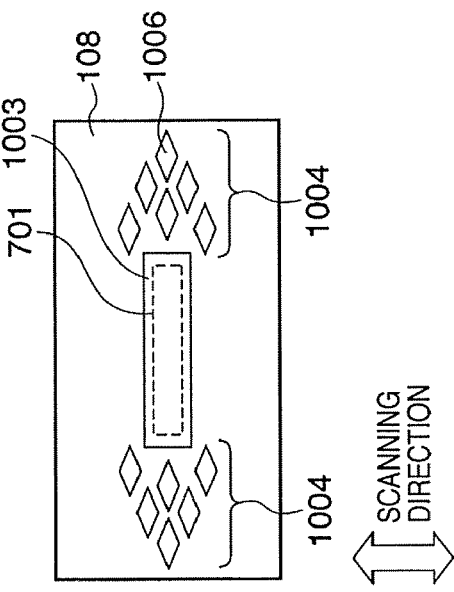
FIGS. 12A to 12D each illustrate the aperture shape of a stop.
Figure 12B:
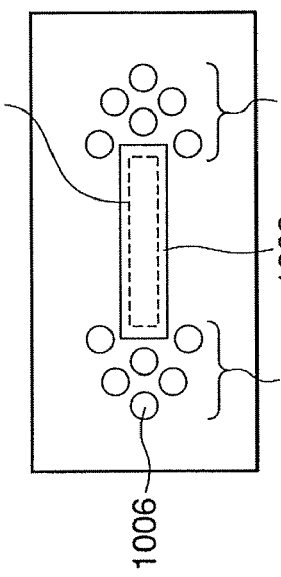
Figure 12C:
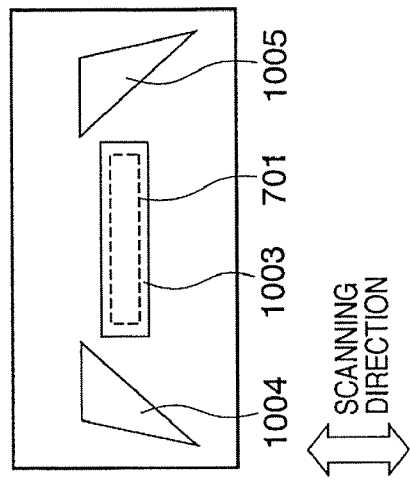
Figure 12D:
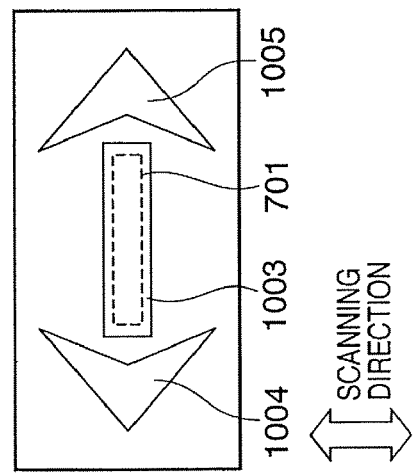

A stop may be built in the projection optical system 106 instead of inserting it between the substrate and the projection optical system 106. For example, as shown in FIG. 8, if the projection optical system 106 is a multiple imaging optical system, the stop 108 may be inserted between two optical elements 612 and 610 which face an intermediate image plane 607 in the projection optical system 106.

<Aperture Shape of Stop>

The exposure region of an exposure apparatus is generally, rotationally asymmetrical. For this reason, the aperture of the stop 108 is preferably rotationally asymmetrical as well. FIGS. 9A to 9D each illustrate the aperture shape of a stop. The stops illustrated in FIGS. 9A, 9B, 9C, and 9D have apertures 705, 706, 707, and 708, respectively.

Let R be the distance between the central position (indicated by "x" in FIGS. 9A to 9D) of an exposure region 701 on the plane of the stop and a position (indicated by "o" in FIGS. 9A to 9D) farthest from the center of the exposure region 701. To shield flare light as much as possible, the area of each of the apertures 705 to 708 is preferably smaller than $\Pi R^2$. FIGS. 9A to 9D each illustrate a stop having an aperture including a portion whose dimension in the first direction parallel to the scanning direction (or a pair of opposite sides of each shot region) changes in accordance with the distance from the center of the aperture in the second direction (a direction perpendicular to the first direction).

Also, FIGS. 10A to 10C, 11, and 12A to 12D each illustrate a stop having an aperture including a portion whose dimension in the first direction parallel to the scanning direction changes in accordance with the distance from the center of the aperture in the second direction. Stops 108 illustrated in FIGS. 10A to 10C have apertures 801, 802, and 803 each with a shape obtained by connecting triangles, semicircles, or sawtoothed figures to the two sides of a rectangle. A stop 108 illustrated in FIG. 11 has an aperture with a shape defined by an arc or curve. Each of stops 108 illustrated in FIGS. 12A and 12B includes a main aperture 1003 and auxiliary aperture arrangements 1004. The auxiliary aperture arrangement 1004 includes a plurality of auxiliary apertures 1006. Each of stops 108 illustrated in FIGS. 12C and 12D includes a main aperture 1003 and auxiliary aperture 1005. The main aperture 1003 passes at least imaging light to form the pattern image of the original on the substrate. Each of the auxiliary apertures 1005 and 1006 passes flare light which is to be incident on the substrate, in order to control the flare light distribution.

FIG. 13 illustrates another example of a stop having an aperture including a portion whose dimension in the first direction parallel to the scanning direction changes in accordance with the distance from the center of the aperture in the second direction. A stop 108 illustrated in FIG. 13 has an aperture 1301 including a main aperture 1003 and auxiliary aperture arrangements 1004. The auxiliary aperture arrangement 1004 can be formed by, e.g., arranging a plurality of rectangular apertures 130 in a certain pattern. The aperture 1301 with this arrangement can be included in an aperture having a portion whose dimension in the first direction parallel to the scanning direction changes in accordance with the distance from the center of the aperture in the second direction. This is because the number of rectangular apertures 130 changes in the order of 3, 2, and 1 in accordance with the distance from the center (a portion indicated by "x") of the aperture 1301. In other words, letting D be the dimension of one rectangular aperture 130 in the first direction (scanning direction), the overall aperture dimension changes in the order of 3D, 2D, and 1D in accordance with the distance from the center (a portion indicated by "x") of the aperture 1301.

In the above embodiment, the shape of the aperture is designed to configure a portion providing a function in which an integral amount in the first direction, of the flare light passing through the stop decreases in accordance with a distance from the center of an aperture of the stop in the second direction. Instead of the above configuration, a light-attenuating filter can be used to form the portion. The light-attenuating filter can be configured to have a transmittance decreasing in accordance with a distance from the center of the aperture in the second direction.

<Application Example>

A device (e.g., a semiconductor integrated circuit device or liquid crystal display device) is manufactured by an exposure step of exposing a substrate coated with a photosensitive agent to light using the exposure apparatus according to the above-described embodiment, a development step of developing the photosensitive agent, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-112295, filed Apr. 20, 2007, which is hereby incorporated by reference herein in its entirety.

What is claimed is:

1. A scanning exposure apparatus which exposes a substrate, the apparatus comprising:
    an illumination system configured to illuminate an illumination region of an original;
    a projection optical system configured to project a pattern of the original onto the substrate; and
    a stop configured to shield a flare generating component of flare light which travels from the projection optical system to the substrate, and to pass the remaining component of the flare light,
    wherein an aperture of said stop has a shape different from a shape of the illumination region,
    wherein said aperture of said stop includes a portion whose dimension in a first direction parallel to a scanning direction of the substrate changes in accordance with a distance from the center of said aperture in a second direction perpendicular to the first direction and said aperture of said stop does not include a side parallel to the scanning direction, and
    wherein flare light reaches a first shot region upon exposing a second shot region that is an adjacent shot region on one side of the first shot region and flare light reaches the first shot region upon exposing a third shot region that is an adjacent shot region on the other side of the first shot region, and a distribution of the sum of amounts of the flare lights that reach the first shot region through the exposure of the second and third shot regions is flat.

2. The apparatus according to claim 1, wherein said aperture has a variable shape that is changed in accordance with an exposure condition.

3. The apparatus according to claim 1, wherein said projection optical system incorporates an intermediate image plane, and said stop is inserted between two optical elements of said projection optical system, which face said intermediate image plane such that the two optical elements face each other via said intermediate image plane.

4. The apparatus according to claim 1, wherein said aperture includes a main aperture which passes at least imaging light to form the pattern image of the original on the substrate, and an auxiliary aperture which passes flare light which is incident on the substrate, in order to control a flare light distribution, wherein the imaging light does not pass through the auxiliary aperture.

5. The apparatus according to claim 1, wherein said aperture has a shape obtained by connecting triangles to two sides of a rectangle.

6. A device manufacturing method comprising:
    exposing a substrate coated with a photosensitive agent using the exposure apparatus defined in claim 1; and
    developing the photosensitive agent on the substrate.

7. The method according to claim 6, wherein said aperture has a variable shape that is changed in accordance with an exposure condition.

8. The method according to claim 6, wherein said projection optical system incorporates an intermediate image plane, and said stop is inserted between two optical elements of said projection optical system, which face said intermediate image plane such that the two optical elements face each other via said intermediate image plane.

9. The method according to claim 6, wherein said aperture includes a main aperture which passes at least imaging light to form the pattern image of the original on the substrate, and an auxiliary aperture which passes flare light which is incident on the substrate, in order to control a flare light distribution, wherein the imaging light does not pass through the auxiliary aperture.

10. The method according to claim 6, wherein said aperture has a shape obtained by connecting triangles to two sides of a rectangle.

* * * * *